United States Patent [19]

Nakanishi et al.

[11] Patent Number: 5,504,022
[45] Date of Patent: Apr. 2, 1996

[54] METHOD OF MAKING A SEMICONDUCTOR MEMORY DEVICE HAVING A FLOATING GATE

[75] Inventors: Toshiro Nakanishi; Yasuhisa Sato, both of Kawasaki, Japan

[73] Assignee: Fujitsu Limited, Kawasaki, Japan

[21] Appl. No.: 172,279

[22] Filed: Dec. 23, 1993

[30] Foreign Application Priority Data

Jan. 7, 1993 [JP] Japan .................................. 5-017117

[51] Int. Cl.⁶ .............................................. H01L 21/8247
[52] U.S. Cl. .................. 437/43; 437/977; 148/DIG. 138
[58] Field of Search ............................. 437/43, 977, 946, 437/225, 228; 257/315, 316, 317; 148/DIG. 138

[56] References Cited

U.S. PATENT DOCUMENTS

| | | | |
|---|---|---|---|
| 4,757,360 | 7/1988 | Faraone . | |
| 4,774,202 | 9/1988 | Pan et al. | 437/43 |
| 4,933,904 | 6/1990 | Stewart et al. | 365/195 |
| 5,017,505 | 5/1991 | Fujii et al. | 437/52 |
| 5,028,560 | 7/1991 | Tsukamoto et al. | 437/81 |
| 5,089,867 | 2/1992 | Lee . | |
| 5,229,334 | 7/1993 | Kato | 437/239 |
| 5,238,500 | 8/1993 | Bergman | 134/3 |
| 5,294,568 | 3/1994 | McNeilly et al. | 437/235 |
| 5,324,676 | 6/1994 | Guterman | 437/43 |
| 5,328,558 | 7/1994 | Kawamura | 156/643 |

FOREIGN PATENT DOCUMENTS

0019468A1  11/1980  European Pat. Off. ............... 437/977

OTHER PUBLICATIONS

Ghandhi, Sorab K., "VLSI Fabrication Principles", pp. 479–482, 522, 1983.

*Primary Examiner*—Olik Chaudhuri
*Assistant Examiner*—Richard A. Booth
*Attorney, Agent, or Firm*—Armstrong, Westerman, Hattori, McLeland & Naughton

[57] ABSTRACT

A method of forming a non-volatile semiconductor memory device includes the steps of forming a generally periodical undulation on a surface of a silicon substrate with a pitch of 1–20 nm, by cleaning the surface of the substrate by a cleaning solution to form a native silicon oxide film that covers the surface of the silicon substrate with a thickness that changes generally periodically, followed by a selective etching process applied to the native silicon oxide film thus formed to expose the surface of the silicon substrate, and forming a tunneling oxide film on the undulated surface of the substrate by applying a thermal oxidation such that the tunneling oxide film has a thickness that changes generally periodically with a pitch of 1–20 nm.

9 Claims, 13 Drawing Sheets

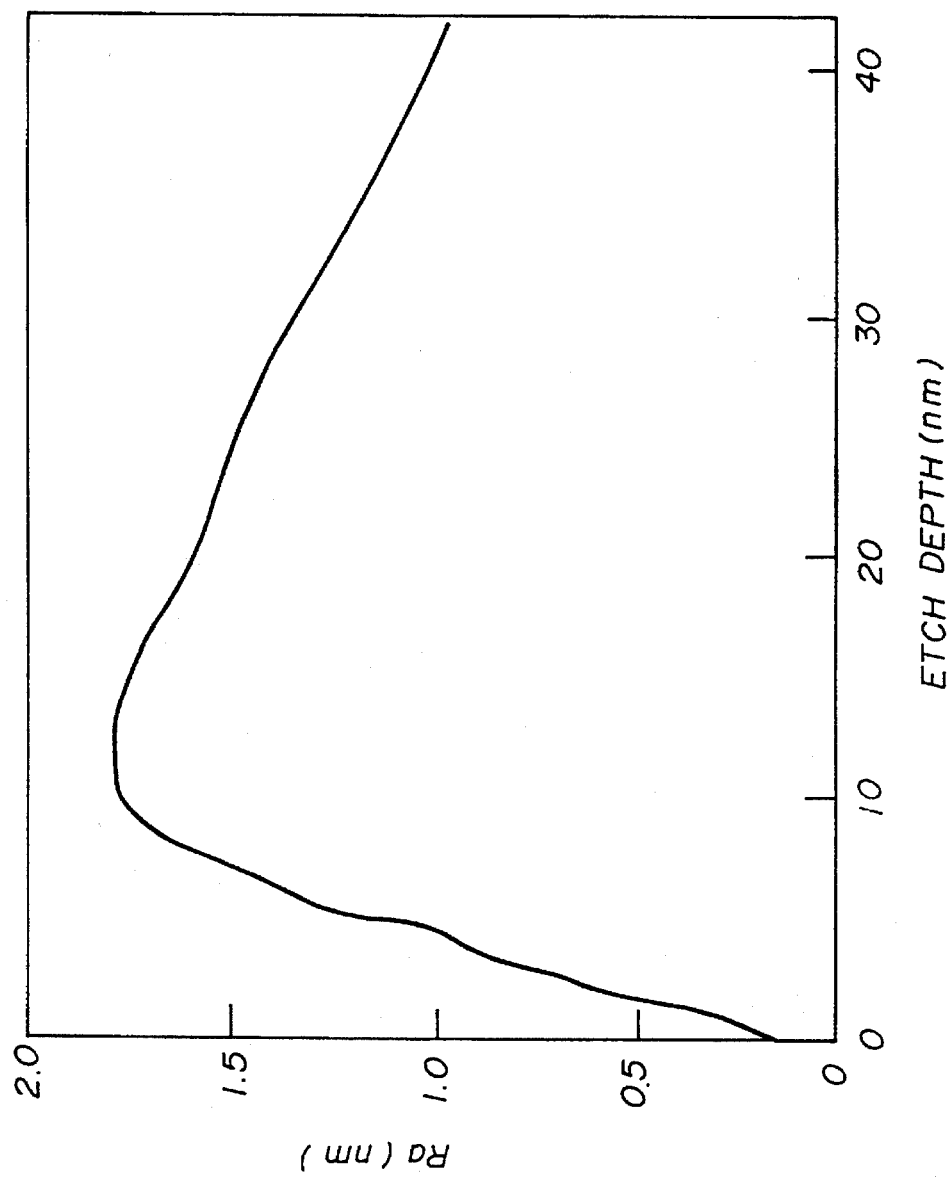

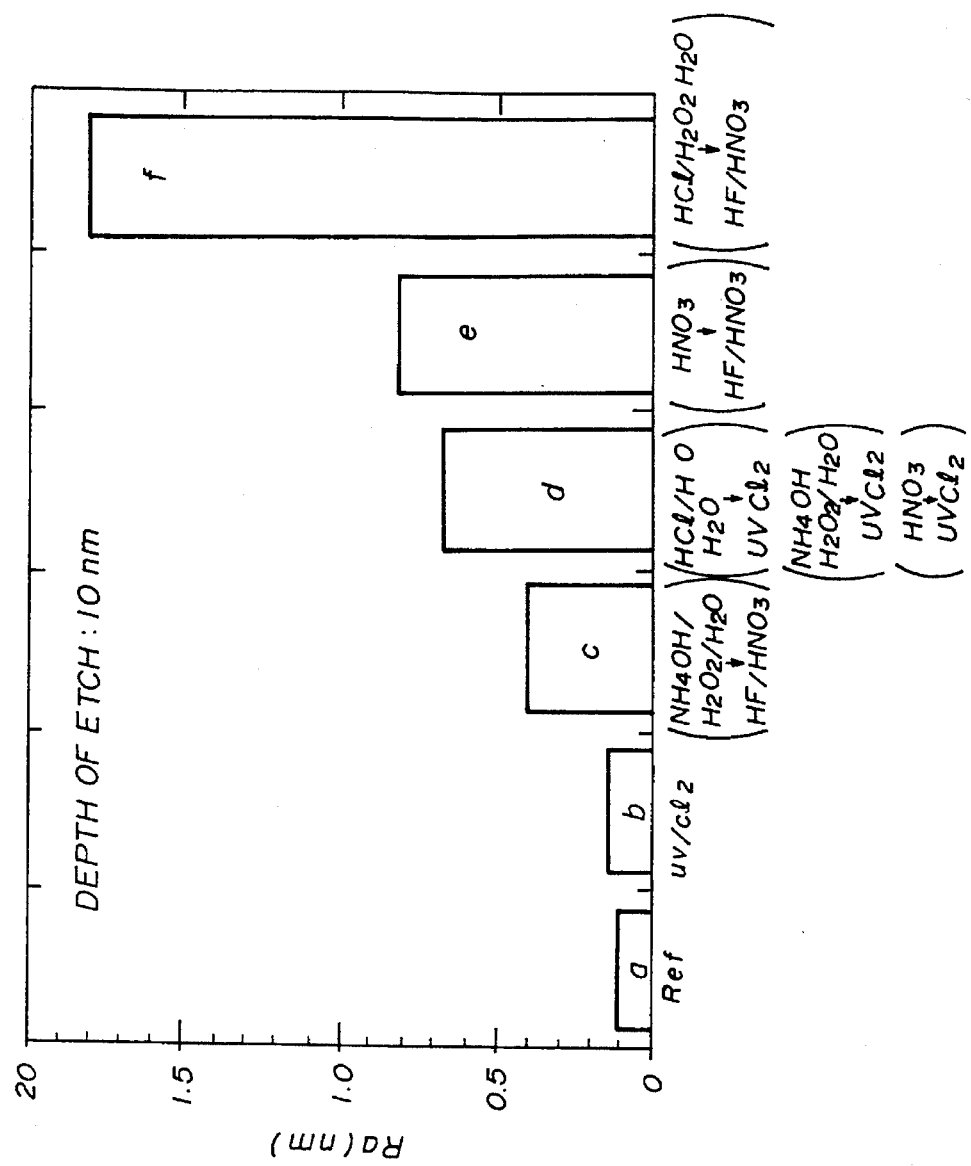

5,504,022

METHOD OF MAKING A SEMICONDUCTOR MEMORY DEVICE HAVING A FLOATING GATE

BACKGROUND OF THE INVENTION

The present invention generally relates to fabrication of semiconductor devices, and more particularly to a fabrication of a semiconductor memory device having a floating gate such as a flash memory or EEPROM, with a step of forming an insulation film that is immune to breakdown even with a repeated injection of electric charges into the floating gate.

Semiconductor memory devices such as flash memories or EEPROMs are characterized by a floating gate for storing information in the form of electric charges. Thereby, the semiconductor memory devices are capable of retaining information for a prolonged time period even when an electric power is cut off. In other words, the semiconductor memory devices having a floating gate operates as a non-volatile semiconductor memory.

With increased storage capacity of semiconductor memory devices associated with the progress in the fabrication technology of integrated circuits, there has emerged a prospect that these nonvolatile semiconductor memory devices, particularly the flash memories, may be used for replacing conventional magnetic memories such as flexible disk drives or hard disk drives. Such non-volatile, solid-state semiconductor memory devices, lacking delicate, moving mechanical parts, have an obvious advantage over the conventional magnetic disk drives in terms of the compact and rigid construction. Thereby, the reliability of the memory devices would improve significantly by using such semiconductor non-volatile memories. In addition, the access time would be reduced significantly.

In the conventional non-volatile semiconductor memory devices such as EEPROM, the storage of information has been achieved by injecting electric charges into the floating gate as a tunneling current through an insulating film that isolates the floating gate. On the other hand, such conventional devices are used for limited purposes and the number of times the data is written is relatively limited. When the non-volatile semiconductor devices are going to be used to replace the magnetic disk drives as in the case of recent flash memories, the number of times the data is written increases significantly. Thereby, the degradation of the insulation film that isolates the floating gate becomes a major problem. It is believed that the major factor that causes such a degradation of the insulation film is the current density of the tunneling current that flows through the insulation film, not the electric field that is applied to the insulation film.

Meanwhile, the state-of-art fabrication technology of semiconductor devices can provide an extremely flat surface on a silicon wafer on which the semiconductor memory device is constructed. Such a fabrication process includes a polishing process for finishing the surface of the silicon wafer with a very high precision. The flat surface of the silicon wafer thus processed is provided with a thin oxide film, and such a thin oxide film is used for the tunneling oxide film of the flash memories. Generally, the tunneling oxide film thus formed has an extremely uniform thickness, and a large electric field is necessary for injecting electric charges therethrough to the floating gate electrode.

FIG. 1 shows a conventional MOS diode that includes an insulation film 42 of silicon oxide formed on a surface of a silicon wafer 41. On the insulation film 42, a polysilicon electrode 43 is provided.

As indicated in FIG. 1, the silicon wafer 41 has a flat, finished surface processed by a polishing process with a high precision in the order of 0.1 nm in terms of surface roughness, and the silicon oxide film 42 is formed on such a flat surface of the silicon wafer 41 by a thermal oxidation process with a uniform thickness. The film 42 is formed to have a thickness for allowing electric charges to flow therethrough from the polysilicon electrode 43 to the substrate 41 or vice versa in the form of tunneling current.

It should be noted that current fabrication process cannot eliminate completely the deposition of dust particles or heavy metal deposits on the surface of the silicon wafer 41, and the tunneling insulation film 42 formed on the wafer 41 generally includes some defects 44 scattered over the surface of the wafer 41. When such defects 44 exist, the thickness of the insulation film 42, typically formed by the thermal oxidation process of the substrate 41, may be reduced locally in correspondence such defects. Further, such a tunneling oxide film 42 may have a reduced resistance in correspondence to the defects when the defect is formed of conductive dust particles such as silicide.

When the tunneling oxide film 42 includes such scattered defects 44, an electric current concentrates to localized, low resistance regions that include the defects 44, and such concentration of the electric current tends to cause a trap of carriers in the insulation film 42. Thereby, the magnitude of the electric field increases further, and such an increase of the electric field in turn invites a concentration of the electric current. Ultimately, the tunneling insulation film 42 is broken down.

Thus, conventional semiconductor non-volatile memory devices, fabricated by a process that includes the step of forming a tunneling insulation film on a polished surface of a silicon wafer, has suffered from the problem of limited lifetime of the tunneling insulation film. When the electric charges are injected to the floating gate electrode repeatedly or for a prolonged time period, the tunneling insulation film tends to show a localized breakdown.

SUMMARY OF THE INVENTION

Accordingly, it is a general object of the present invention is to provide a novel and useful process for fabricating a semiconductor non-volatile semiconductor memory device having a floating gate electrode, wherein the foregoing problems are eliminated.

Another and more specific object of the present invention is to provide a non-volatile semiconductor memory device having a floating gate electrode and a fabrication process of the same, wherein a tunneling insulation film that isolates the floating gate electrode has a prolonged lifetime against breakdown and allows an increased number of times for rewriting information in the floating gate electrode.

Another object of the present invention is to provide a process for fabricating a non-volatile semiconductor memory device having an isolated floating gate for storing information in said floating gate in the form of electric charges, comprising the steps of:

forming a generally periodical undulation on a surface of a silicon substrate;

subjecting said silicon substrate thus formed with said periodical undulation to a thermal oxidation process to form a silicon oxide film on said silicon substrate as a tunneling oxide film, such that said tunneling oxide film has a thickness that changes generally periodically in correspondence to said periodical undulation of said silicon substrate;

forming a gate electrode on said silicon oxide film as a floating gate;

covering said floating gate electrode with an insulating film; and providing a control gate electrode on said insulating film.

According to the present invention, the thickness of the tunneling oxide film is reduced periodically with a pitch in the order of 1–20 nm. Thereby, the voltage or electric field necessary for causing a tunneling current to flow through the tunneling oxide film is substantially and effectively reduced, and the stress applied to the tunneling oxide film is accordingly reduced. As a result, the number of times the information is written or rewritten into the floating gate of the semiconductor memory device in the form of tunneling current, increases substantially. In other words, the present invention provides a long life-time, reliable non-volatile semiconductor memory device generally known as flash memory.

In a preferred embodiment of the present invention, said step of forming the undulation comprises the steps of:

forming a native silicon oxide film on the surface of the silicon substrate with a thickness that changes generally periodically with a pitch falling in a range of 1–20 nm; and applying a selective etching process against said native silicon oxide film such that said selective etching process acts against silicon oxide with a first etching rate and against silicon with a second, larger etching rate, such that said native silicon oxide film is removed and said surface of said silicon substrate is etched to show a generally undulating surface morphology corresponding to said periodically changing thickness of said native silicon oxide film.

In another preferred embodiment of the present invention, said step of forming the native silicon oxide film comprises a step of cleaning the surface of said silicon substrate, said step of cleaning comprising a step of oxidizing the surface of said silicon substrate and a step of etching silicon oxide formed on said surface of said silicon substrate, wherein said step of oxidizing and said step of etching are conducted substantially simultaneously in a solution that contains an oxidizing agent and an etchant. By achieving the competing processes of oxidization and etching in a solution simultaneously, the desired generally periodical change of thickness is caused in the native silicon oxide film as a result of localized fluctuation of concentration in the solution. Further, such a cleaning process removes contaminants from the surface of the substrate, and the tunneling oxide film is formed on the undulating surface of the substrate without substantial defects.

In another preferred embodiment of the present invention, said step of cleaning is achieved by immersing said silicon substrate in a heated solution of hydrochloric acid, hydrogen peroxide and water.

In another preferred embodiment of the present invention, said step of cleaning is achieved by immersing said silicon substrate in an aqueous solution of ammonia and hydrogen peroxide.

In another preferred embodiment of the present invention, said step of forming said native silicon oxide film comprises a step of processing the surface of the silicon substrate by a heated solution of nitric acid.

In another preferred embodiment of the present invention, said step of applying the selective etching process comprises a step of immersing said substrate carrying thereon said native silicon oxide film in a solution of hydrofluoric acid and nitric acid.

In another preferred embodiment of the present invention, said step of applying the selective etching process comprises a step of exposing said substrate carrying thereon said native silicon oxide film to a chlorine gas under ultraviolet radiation.

Another object of the present invention is to provide a non-volatile semiconductor memory device for storing information in the form of electric charges, comprising:

a silicon substrate doped to a first conductivity type, said silicon substrate having an upper major surface;

a channel region of said first conductivity type defined in said silicon substrate in correspondence to said upper major surface;

first and second diffusion regions of a second, opposite conductivity type formed in said substrate at both lateral sides of said channel region;

a tunneling oxide film provided on said substrate so as to cover said upper major surface of said substrate in correspondence to said channel region, said tunneling oxide film having a thickness small enough to cause a tunneling of carriers therethrough;

a floating gate electrode provided on said tunneling oxide film, said floating gate electrode being defined by upper and lower major surfaces as well as side walls that surround said floating gate electrode laterally and storing information in the form of electric charges injected thereto through said tunneling oxide film in the form of a tunneling current;

an insulating film provided on said floating gate electrode so as to cover said upper major surface as well as said side walls of said floating gate electrode; and a control gate electrode provided on said insulating film for controlling electric field applied to said tunneling oxide film;

said silicon substrate having a generally periodical undulation on said upper major surface at least in correspondence to said channel region;

said tunneling oxide film having a generally periodical variation in the thickness in correspondence to said undulation of said upper major surface of said substrate.

According to the present invention, it is possible to reduce the strength of the electric field that is applied to the tunneling oxide film when injecting electric charges from the substrate to the floating electrode or vice versa, by providing the controlled periodical variation of thickness in the tunneling oxide film. In such a structure, the tunneling current flows through the part of the tunneling oxide film wherein the thickness of the tunneling oxide film is reduced. As the tunneling oxide film has a generally periodical variation in the thickness, the structure of the present invention eliminates the concentration of current to a particular location of the film, while simultaneously achieving the effect of reduced electric field necessary for flowing a desired amount of electric charges through the tunneling oxide film.

Other objects and further features of the present invention will become apparent from the following detailed description when read in conjunction with the attached drawings.

BRIEF DESCRIPTION OF THE DRAWINGS

FIG. 5 is a diagram showing the relationship between the surface roughness of the substrate treated by the process of the present invention, as a function of the depth of etching;

FIG. 6 is a diagram showing the surface roughness of the processed silicon substrate for various combination of the surface treatments;

DETAILED DESCRIPTION OF THE PREFERRED EMBODIMENTS

Figure 1:
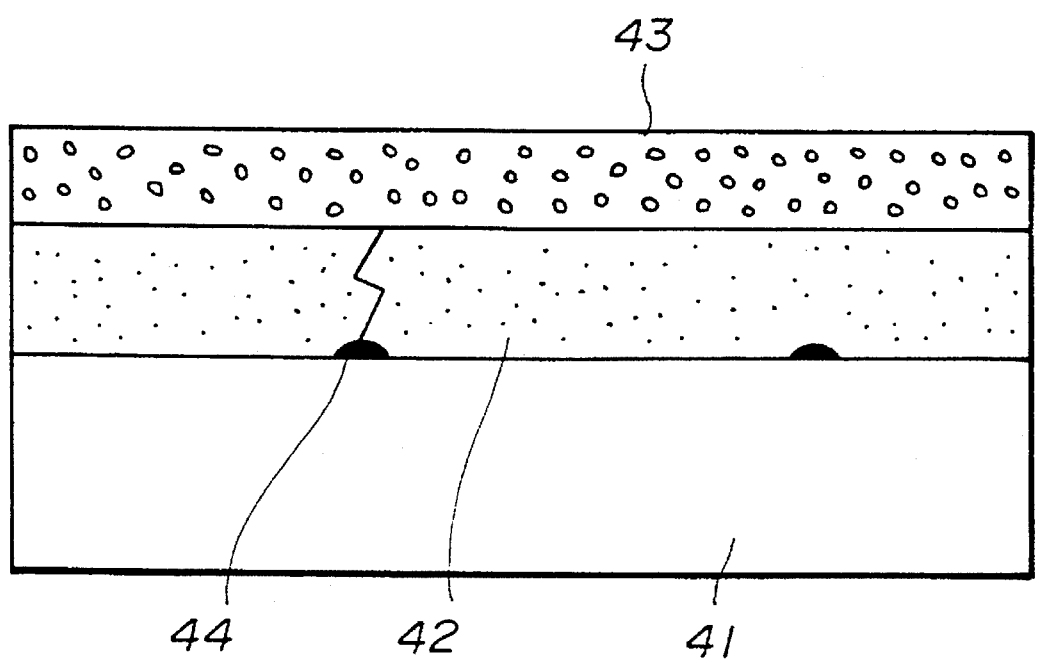
FIG. 1 is a diagram showing the structure of a conventional MOS diode structure formed on a silicon substrate.
Figure 2A:
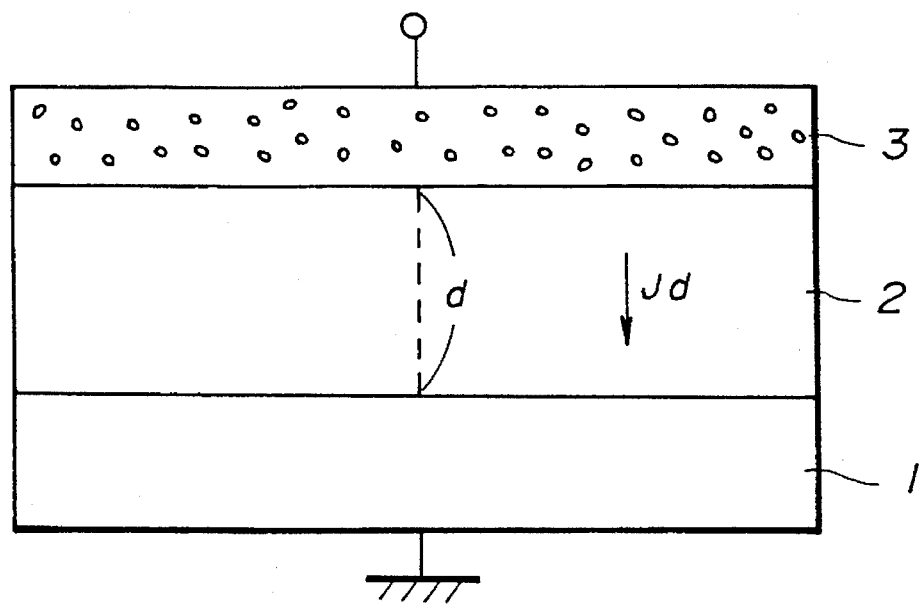
FIGS. 2(A) and 2(B) are diagrams showing the principle of the present invention with reference to a simplified, model MOS diode structure.
Figure 2B:
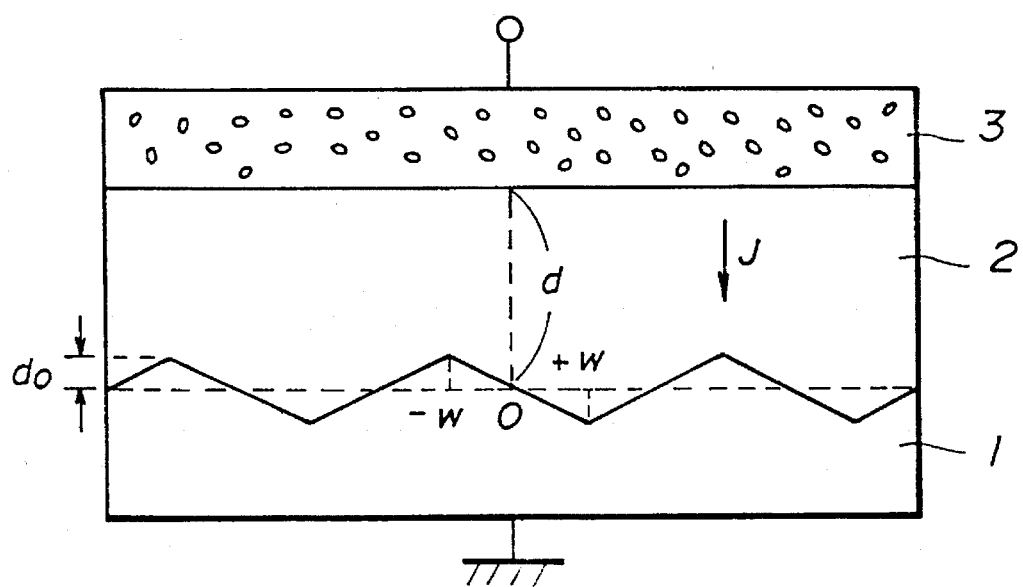

First, the principle of the present invention will be described with reference to FIGS. 2(A) and 2(B), wherein FIG. 2(A) shows the structure of a model MOS diode formed of a silicon substrate 1. As will be noted, the MOS diode includes an insulating film 2 of silicon oxide provided on the silicon substrate 1 with a thickness d, and an electrode 3 of polysilicon covers the insulating film 2. FIG. 2(B), on the other hand, shows the structure another model MOS diode similar to FIG. 2(A) except that the surface the substrate 1 is given with a periodical undulation. As a result, it will be noted that the thickness of the insulating film 2 changes also periodically.

Generally, the current density $J_d$ of a tunneling current flowing through an insulating film having planar, flat upper and lower major surfaces as in the case of the MOS diode of FIG. 2(A), is represented as $$J_d = C \cdot E^2 \cdot \exp(-B/E)$$

wherein the parameters C and B are represented respectively as $$C = q^3 m / 16\pi^2 h m_{ox} \phi_0$$

and $$B = 4(2m_{ox})^{1/2} \phi^{3/2} / 3qh,$$

in which E represents the strength of the electric field in the insulating film 2, m represents the rest mass of an electron, q represents the electric charge of a single electron, h represents the Planck's constant, $m_{ox}$ represents the effective mass of an electron in the insulating film 2, and $\phi_0$ represents the barrier height at the semiconductor-oxide interface between the substrate 1 and the insulating film 2.

When there is a periodical variation in the thickness of the tunneling oxide film 2 as in the device of FIG. 2(B), on the other hand, the average current density J of the tunneling current flowing through the insulating film 2 over a region extending from $-w$ to $+w$ in correspondence to a half-pitch interval of the periodical variation as indicated in FIG. 2(B), is represented approximately as $$J \approx J_d \{1 + (\alpha \delta)^2/6\}$$

where the parameter $\delta$ is represented as $$\delta = d_0/d \text{ and } \alpha = \beta/E,$$

in which $d_0$ represents the amplitude of the undulation and d represents the average thickness of the insulating film 12.

It will be understood clearly from the foregoing equation that the current density of the tunneling current increases by a factor of $\{1 + (\alpha \delta)^2/6\}$ in the insulating film 12 in correspondence to the variation of thickness of the insulating film 2. This in turn indicates that one can use a reduced electric field in order to achieve the desired carrier density when injecting or removing the electric charges to and from the floating gate electrode of a flash memory. Alternatively, one can reduce the duration of the electric charge injection. It should be noted that the TDDB (time dependent dielectric breakdown) lifetime $\tau_{bd}$ of the tunneling oxide film is represented as $$\tau_{bd} \propto \exp\{(B+H)/E_{ox}\},$$

where B is defined before and $E_{ox}$ represents the strength of the electric field applied to the tunneling oxide film (See I. C. Chen et al., IEEE Electr. Dev. Lett. EDL-8, 140, 1987). Generally, the parameter B has a value of about 240 MV/cm while the parameter H has a value of about 80 MV/cm. Further, $E_{ox}$ represents the electric field strength applied to the insulating film.

The forgoing equation indicates that one can increase the lifetime of the insulting film 2 acting as a tunneling oxide film by reducing the strength of the electric field applied to the tunneling oxide film 2 in the structure of FIG. 2(B). Thus, by employing a tunneling oxide film 2 having a periodically changing thickness, it becomes possible to increase the lifetime of the tunneling oxide film 2, rather than decreasing the same.

Figure 3:
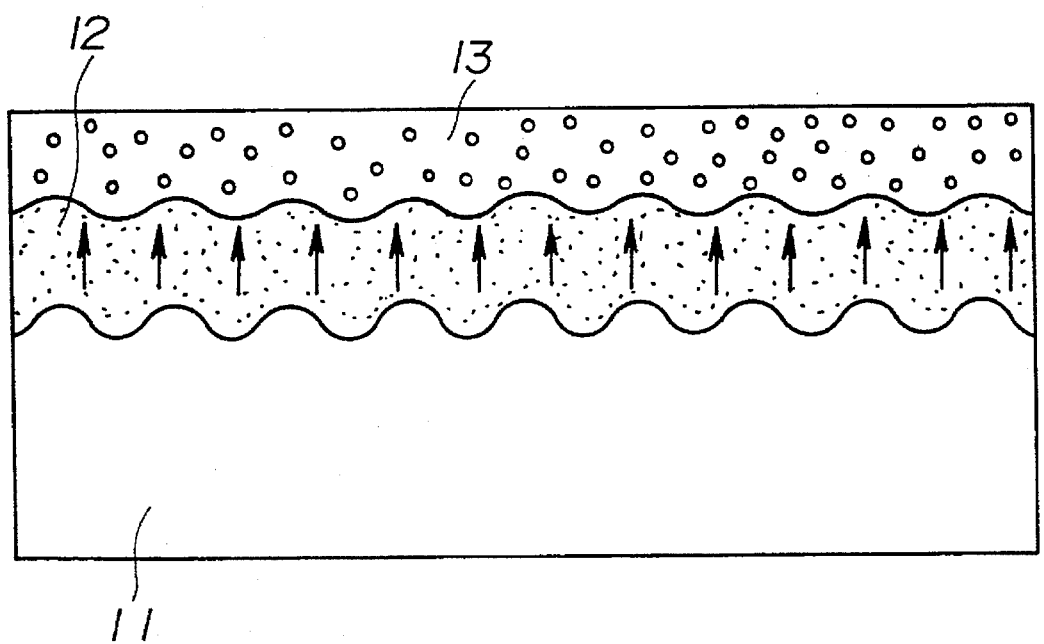
FIG. 3 is a diagram showing the MOS diode structure forming a part of the flash memory device according to a first embodiment of the present invention.

Next, a first embodiment of the present invention will be described with reference to FIG. 3 showing a MOS diode having a structure corresponding to the structure of FIG. 2(B). As will be noted from the description that follows with reference to the second embodiment of the present invention, the structure of FIG. 3 corresponds to the essential part of a memory cell transistor forming a flash memory device.

Referring to FIG. 3, the MOS diode includes a tunneling oxide film 12 grown on a surface of a silicon substrate 11 by a thermal oxidation process typically conducted in a dry oxygen environment as will be described later in detail, and a polysilicon electrode layer 13 is provided on the tunneling oxide film 12.

In the structure of FIG. 3, it will be noted that the surface of the silicon substrate 11 is provided with an undulation that is repeated more or less periodically with a pitch of 1–20 nm.

The tunneling oxide film 12 formed on the undulated upper major surface of the silicon substrate 11 by such a thermal oxidation process has a corresponding undulated upper major surface, while the amplitude of undulation is substantially reduced as compared with the amplitude of undulation at the upper major surface of the substrate 11.

Thereby, the tunneling oxide film 12 has a thickness that changes generally periodically in correspondence to the undulation on the upper major surface of the substrate 11.

As explained before with reference to FIGS. 2(A) and 2(B), such a periodical change for the thickness of the tunneling oxide film 12 provides an increased current density of the tunneling current that flows through the tunneling oxide film 12 upon application of a voltage across the substrate 11 and the electrode 13, and such an increase in the tunneling current in turn enables a decrease in the electric field applied to the tunneling oxide film 12 for achieving a transport of given, predetermined amount of electric charges through the film 12 by tunneling. In such a structure, because of the periodical and smooth variation in the thickness of the tunneling oxide film 12, localized concentration of electric charges is avoided in the film 12.

Next, the fabrication process of the structure of FIG. 3 will be described with reference to FIGS. 4(A)–4(D).

Figure 4A:
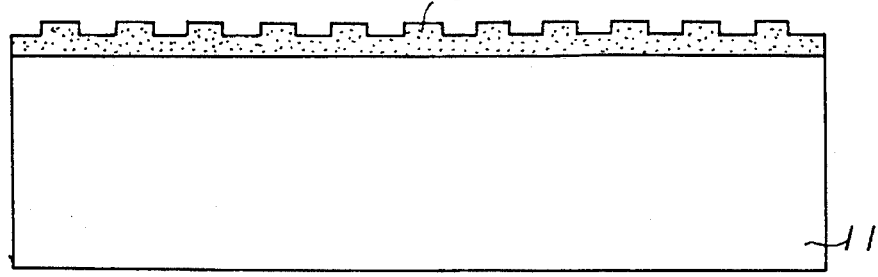
FIGS. 4(A)–4(D) are diagrams showing the fabrication process for forming the MOS diode structure of FIG. 3.

In the step of FIG. 4(A), the silicon substrate 11 is prepared such that the upper major surface of the silicon substrate 11 is covered by a native oxide film 12 of silicon oxide. Thereby, the native oxide film 12 is formed to carry minute projections and depressions repeated generally with a pitch of 1–20 nm.

More specifically, a polished silicon substrate corresponding to the foregoing silicon substrate 11 that may or may not carry thereon a native oxide film is dipped into a heated aqueous solution of HCl, $H_2O_2$ and $H_2O$, wherein the aqueous solution contains HCl, $H_2O_2$ and $H_2O$ with a volumetric ratio of 2:3:6. The native oxide film covering the surface of the silicon substrate 11 has a substantially flat upper major surface before the process of treating the substrate in the foregoing aqueous solution, while after a treatment for about 10 minutes, an undulating structure shown in FIG. 4(A) is formed on the surface of the native oxide film as indicated by a numeral 12a, due to the oxidation of silicon caused by $H_2O_2$ and a weak etching process of silicon oxide caused by HCl.

It should be noted that the oxidation by $H_2O_2$ and the weak etching of silicon oxide by HCl competes with each other on the substrate 11, and it is believed that a small fluctuation in the concentration of the aqueous solution leads to such a non-uniform surface structure of the native oxide film 12a. As the etching of HCl is very weak, the native oxide film 12a remains on the surface of the substrate after the foregoing process, although the surface of the film 12a experiences an undulation as indicated in FIG. 4(A). It should be noted that the foregoing aqueous solution has conventionally been used for cleaning the surface of silicon substrate. Thus, the process of FIG. 4(A) is also useful for removing any contaminants from the surface of the substrate 11. Hereinafter, the solution that is employed for forming the structure of FIG. 4(A) will be referred to as a cleaning solution.

Figure 4B:
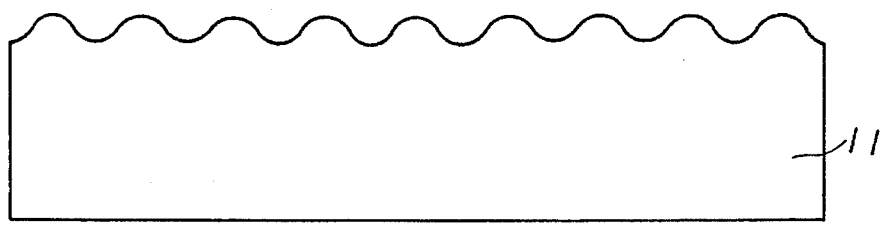

Next, in the step of FIG. 4(B), the surface of the silicon substrate 11 carrying thereon the native oxide film 12a is subjected to a chemical etching process for removing the native oxide film 12. In this process, an etching solution that shows a strong selectively against silicon and silicon oxide is used such that silicon is etched with a large etching rate while silicon oxide is etched with a smaller etching rate. Typically an etching solution of HF and $HNO_3$ is used with a volumetric ratio of 1:1000, for example, wherein $HNO_3$ oxidizes silicon while HF etches the silicon oxide formed as a result of oxidation. In the foregoing composition of the etching solution, the etching of silicon substrate 11 proceeds with a rate much larger than the etching rate of the native silicon oxide film 12a.

As long as there exists the native oxide film 12a on the surface of the substrate 11, the etching proceeds slowly and uniformly because of the small etching rate of the etching solution against silicon oxide, while once the native oxide film 12a is removed in correspondence to the part where the thickness of the native oxide film 12a is small and the surface of the silicon substrate 11 exposed, the etching of the substrate 11 starts with a much larger rate in correspondence to the exposed region, and the undulation develops on the surface of the substrate. Thereby, the native oxide film 12a, partially exposing the surface of the substrate 11, acts as an etching mask. Eventually, all the native oxide film 12a is removed, and there is formed an undulating structure on the surface of the substrate 11 generally in correspondence to the undulation formed on the native oxide film 12a.

Attached photographs 1 and 2 compares the structure thus obtained on the surface of the silicon substrate, wherein the photograph 1 shows the surface roughness of the surface of a polished silicon substrate after removing the native oxide film by the etching solution, while the photograph 2 shows the surface roughness of the substrate 11 obtained in the step of FIG. 4(B) in the state that the oxide film is removed from the surface as a result of the process by the cleaning solution followed by the selective etching process. In the experiment of the photograph 2, a polished silicon substrate having substantially the same surface roughness has been used. It should be noted that photographs 1 and 2 are obtained by observing the exposed silicon surface of the substrate 11 by an atomic force microscope (AFM) after removing the silicon oxide film.

As will be noted from the photograph 1, the surface of the silicon substrate 11 is entirely flat and the magnitude of undulation is about 1 nm or less in terms of the surface roughness. On the other hand, the photograph 2 indicates that there exist extensive and conspicuous undulations on the surface of the silicon substrate 11, wherein the magnitude of the surface roughness reaches as much as 10 nm or more. Further, such an undulation is formed generally periodically in the X- and Y- directions, with a pitch of 1–20 nm. In the photographs, the scales attached to the X-, Y- and Z-axes are represented in terms of nanometers. The result of the photographs 1 and 2 clearly demonstrate the effect of the processes described above with reference to FIGS. 4(A) and 4(B) for forming the intentional undulation on the surface of the silicon substrate 11 with a very small pitch. It should be noted that the phrase "generally periodically" used herein means the surface structure shown in the photograph 2 wherein the surface morphology undulates more or less sinusoidally with pitch or wavelength that may change place by place in a certain range. In the example of the photograph 1, it will be seen that the variation of the pitch falls in a range of 1–20 nm as noted above.

Figure 4C:
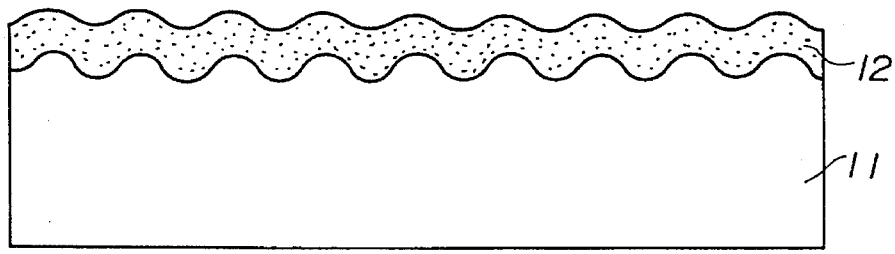

The silicon substrate 11 thus formed with the undulation is then subjected to a thermal oxidation process that is typically conducted at 1000° C. in a nitrogen atmosphere that contains 8 volumetric percent of oxygen. The thermal oxidation process is carried out for 2 minutes and 54 seconds, and the silicon oxide film 12 is formed on the undulated surface of the substrate 11 with a thickness of less than 10 nm, preferably about 7 nm as indicated in FIG. 4(C). As a result of the thermal oxidation process, the surface of the silicon oxide film shows a smooth, generally periodical undulation corresponding to the undulation of the surface of the silicon substrate 11.

Referring to FIG. 4(C), it will be noted that the amplitude or magnitude of the undulation is smaller on the exposed upper major surface of the silicon oxide film 12 as compared with the undulated surface of the silicon substrate 11 underneath the film 12, because of the factors such as the lateral diffusion of Si atoms occurring over the surface of the silicon substrate as well as because of the plastic deformation of the silicon oxide film 12. As a result, the silicon oxide film 12 has a thickness that changes more or less periodically about the foregoing average thickness value of 7 nm.

Figure 4D:
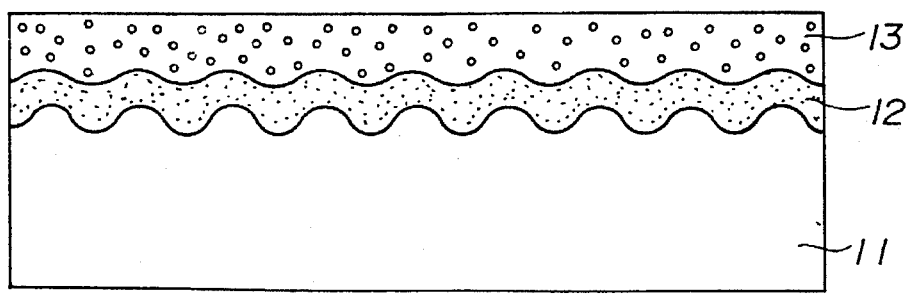

On the structure of FIG. 4(C) thus obtained, a polysilicon layer is deposited as the electrode layer 13 with a thickness of 200 nm and the structure shown in FIG. 4(D) is obtained. It should be noted that the structure of FIG. 4(D) may constitute a part of a flash memory. Alternatively, the structure of FIG. 4(D) may form a MOS diode.

FIG. 5 shows the relationship between the surface roughness obtained in the structure of FIG. 4(B) and the depth of etching caused by the etching solution of HF and $HNO_3$.

Referring to FIG. 5, it will be noted that the surface roughness indicative of the magnitude of undulation increases generally proportionally with the depth of etching until the depth of etching reaches an optimum value of about 10 nm. Thereafter, the surface roughness decreases gradually with increasing depth of etching. It is believed that the relationship of FIG. 5 indicates the effect of the native oxide film 12a acting as an etching mask in the range where the depth of etching is smaller than about 10 nm. With further progress of etching, the native oxide film 12a disappears completely and the mask for the etching of the substrate 11 to form the undulation disappears. Thus, in the range of the depth of etching exceeding about 10 nm, the etching proceeds more or less uniformly over the silicon substrate without mask, and the magnitude of the undulation or surface roughness of the substrate 11 decreases accordingly.

It should be noted that various other combinations of the etching solutions may be used for achieving the result of FIGS. 4(A) and 4(B). For example, one may employ a heated aqueous solution of $NH_4OH$, $H_2O_2$ and $H_2O$ for forming the structure of FIG. 4(A). Further, one may employ a chlorine etching gas ($Cl_2$) for forming the structure of FIG. 4(B) in combination with ultraviolet radiation.

FIG. 6 compares the surface roughness Ra of the silicon substrate shown in FIG. 4(B) for various combinations of the etching solutions.

Referring to FIG. 6, the result for samples a designated as "ref" corresponds to the photograph 1, indicating the state of the surface of the polished silicon substrate after removing the native oxide film. As can be seen in FIG. 6, the surface roughness Ra of this reference substrate has a magnitude of about 0.1 nm.

When such a polished substrate is subjected to a thermal oxidation process to form a thermal oxide film followed by an etching process, conducted by a $Cl_2$ etching gas under the presence of ultraviolet radiation, to remove the oxide film, the surface roughness Ra increases slightly as indicated by the data for samples b. However, there is no material difference between the result for the samples a and the result for the samples b.

The data for samples c of FIG. 6 shows, on the other hand, the result wherein the surface of the polished silicon substrate is processed by the aqueous cleaning solution of $NH_4OH$, $H_2O_2$ and $H_2O$ followed by a selective etching process by the etching solution of HF and $HNO_3$. As can be seen in FIG. 6, the surface roughness Ra increases up to about 0.4 nm that is about four times as large as the result for the samples a and b.

The data for samples d shows the result wherein the surface of the polished silicon substrate is processed by the aqueous cleaning solution of HCl, $H_2O_2$ and $H_2O$ followed by a selective etching process by the $Cl_2$ gas under presence of ultraviolet radiation. In this case, a surface roughness of about 0.7 nm is achieved. It will be noted that a similar result is obtained also when the substrate is processed by the aqueous cleaning solution of $NH_4OH$, $H_2O_2$ and $H_2O$ followed by the selective etching process by the $Cl_2$ gas under the presence of ultraviolet radiation.

Further, a similar result for the surface roughness is obtained also when the substrate is oxidized by $HNO_3$ followed by the selective etching process by the $Cl_2$ gas under presence of ultraviolet radiation. By processing the surface of the silicon substrate by $HNO_3$, a native oxide film is formed with a minute surface irregularity similar to the one shown in FIG. 4(A). Thus, by applying the selective etching process to the substrate thus processed by $HNO_3$, one obtains the structure having the surface undulation similar to the one shown in FIG. 4(B).

The data for samples e of FIG. 6 shows the result for the case wherein the polished silicon substrate is processed first by $HNO_3$ to form the native oxide film followed by the selective etching process by the solution of HF and $HNO_3$. In this case, an even more enhanced surface roughness of about 0.8 nm is achieved.

Further, the data for samples f shows the result for the case wherein the polished silicon substrate is processed first by the aqueous cleaning solution of HCl, $H_2O_2$ and $H_2O$ followed by the selective etching process by the etching solution of HF and $HNO_3$. In this case, a surface roughness reaching a value of 1.8 nm is obtained. This value of surface roughness is 18 times as large as the surface roughness obtained for the reference samples a.

In any of the foregoing data for the samples a–f, it should be noted that the selective etching process has been achieved with a depth of 10 nm in correspondence to the previously mentioned optimum depth of etching.

Figure 7:
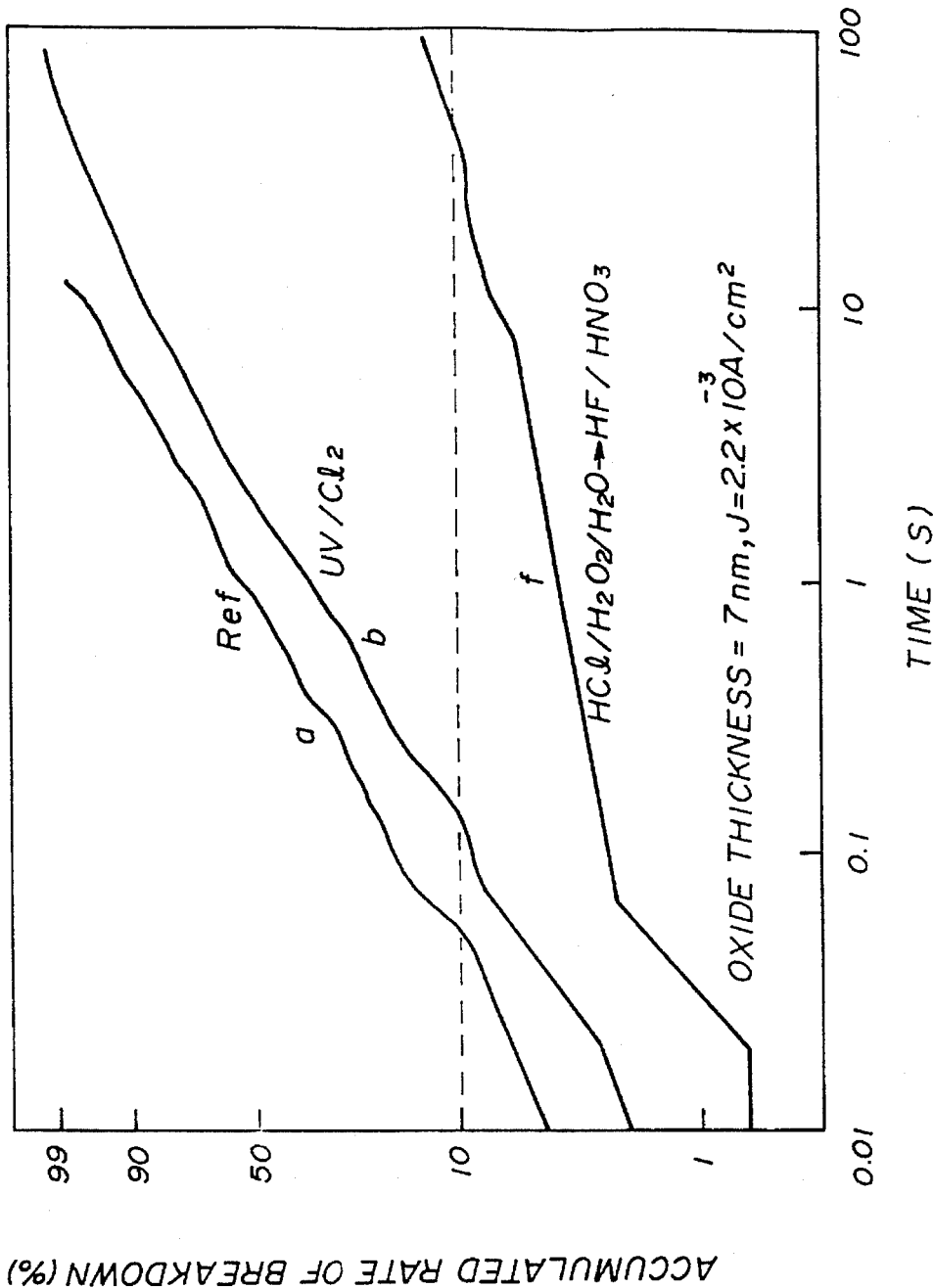
FIG. 7 is a diagram showing the TDDB characteristics of the MOS diode of FIG. 3 under the constraint of constant current density of tunneling current.

FIG. 7 shows the result of experiment conducted for the MOS diode formed by the process of FIGS.4(A)–4(D), with respect to reliability. In FIG. 7 showing the TDDB characteristics, the result of the experiment is represented in the form of accumulated rate of breakdown of the MOS diode. The experiment was conducted by flowing a current with a predetermined current density J of $2.2 \times 10^{-3}$ A/cm² through the silicon oxide film 12 while observing for the breakdown of the MOS diode. The MOS diodes used for the experiment were fabricated by forming the tunneling oxide film 12 of silicon oxide on the surface of the substrate 11 followed by a deposition of the electrode layer 13, wherein the electrode layer 13 was patterned to have a surface area of $1.39 \times 10^{-3}$ cm². As noted already, the silicon oxide film 12 was formed to have a thickness of about 7 nm.

Referring to FIG. 7 showing the accumulated rate of breakdown as a function of time, the curve designated as a corresponds to the samples designated as a in FIG. 6. As will be noted, the curve a extends generally linearly in the logarithmic time plot of the accumulated rate of breakdown, and an accumulated rate of deposition of 10% is reached within 0.1 seconds from the start of the experiment. In other words, the MOS diode fails immediately after the start of experiment.

The curve designated as b in FIG. 7 corresponds to the samples b of FIG. 6 and extends generally parallel with the curve a though with a slightly reduced value for the accumulated rate of breakdown. In correspondence to this, the curve b reaches the accumulated rate of deposition of 10% after a time of 0.1 seconds has elapsed. This result, however, is a not significant improvement over the result designated as a.

Further, the curve designated as f corresponds to the samples f of FIG. 6. It will be noted that the curve f shows a much reduced accumulated rate of breakdown as compared with any of the curves a and d, as being clearly indicated by the 10% value of the accumulated rate of deposition that is reached only after a time well exceeding 10 seconds. In other words, the MOS diode corresponding to the samples f has a lifetime that is larger by as much as 1200 times than the MOS diode of the samples a.

Figure 8:
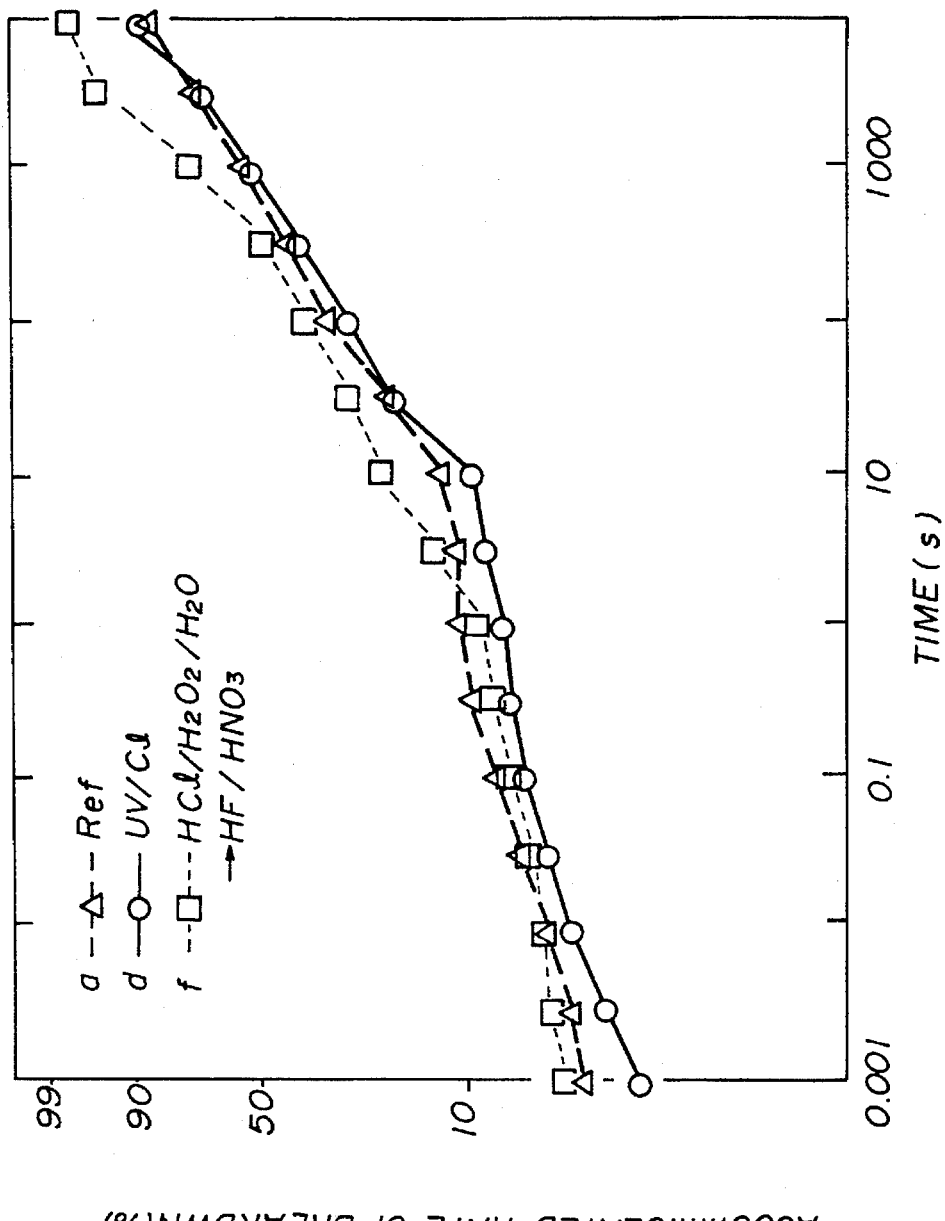
FIG. 8 is a diagram showing the TDDB characteristics of the MOS diode of FIG. 3 under the constraint of constant electric field in the tunneling oxide film.

FIG. 8, on the other hand, shows the accumulated rate of breakdown as a function of time for the samples a, d and f, wherein a constant electric field of 9 MV/cm is applied across the silicon oxide film 12. In the experiment of FIG. 8, 145 electrodes were provided on the silicon oxide film 12 that covers the substrate 11 as the electrode 13, wherein each electrode was formed to have an area of 1.09 cm$^2$.

In the experiment of FIG. 8 conducted under the constant electric field, it will be noted that there exists no substantial difference between any of the samples a, d and f. The value for the accumulated rate of breakdown increases generally linearly in the logarithmic time plot.

The foregoing results of FIGS. 7 and 8 clearly indicate that the preferable prolonged lifetime of the MOS diode is achieved in the construction of the present invention only when the level of the current flowing through the MOS diode is set to realize a predetermined, constant current density. As a result of the undulation, which in turn causes a generally periodical variation in the thickness of the silicon oxide film 12, one can reduce the electric field applied to the silicon oxide film 12 in order to achieve the necessary, predetermined current density as in the case of FIG. 7. When a large electric field is applied to the silicon oxide film 12 in such a structure as in the case of FIG. 8, on the other hand, a very large tunneling current flows through the silicon oxide film 12 and the benefit of the present invention to increase the lifetime of the MOS diode and hence the lifetime of the tunneling oxide film by reducing the electric field in the silicon oxide film 12, is not attained.

Figure 9A:
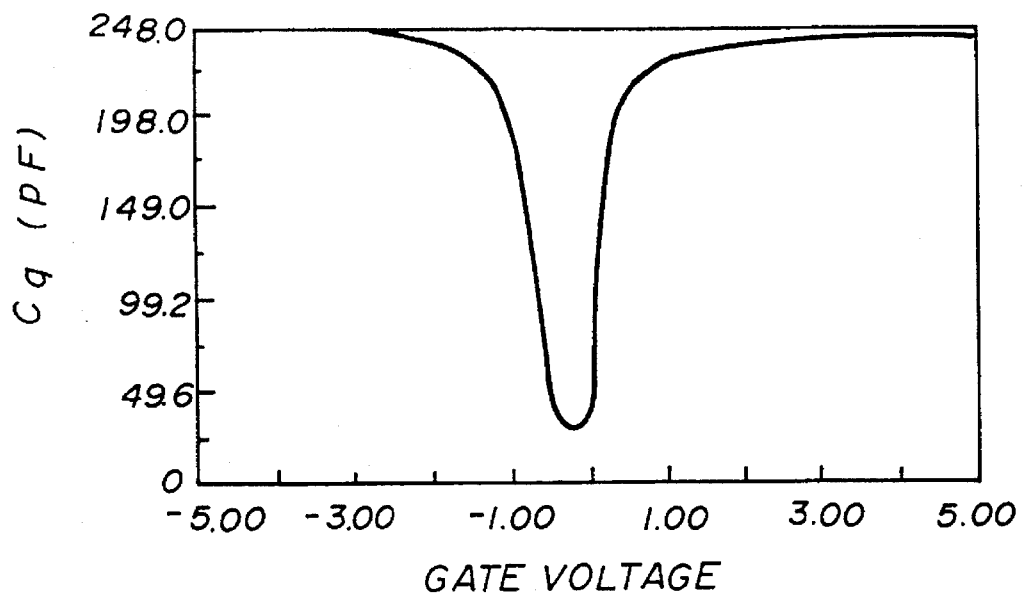
FIGS. 9(A) and 9(B) are diagrams showing the capacitance versus voltage characteristics respectively for the MOS diode of FIG. 3 and the conventional MOS diode.
Figure 9B:
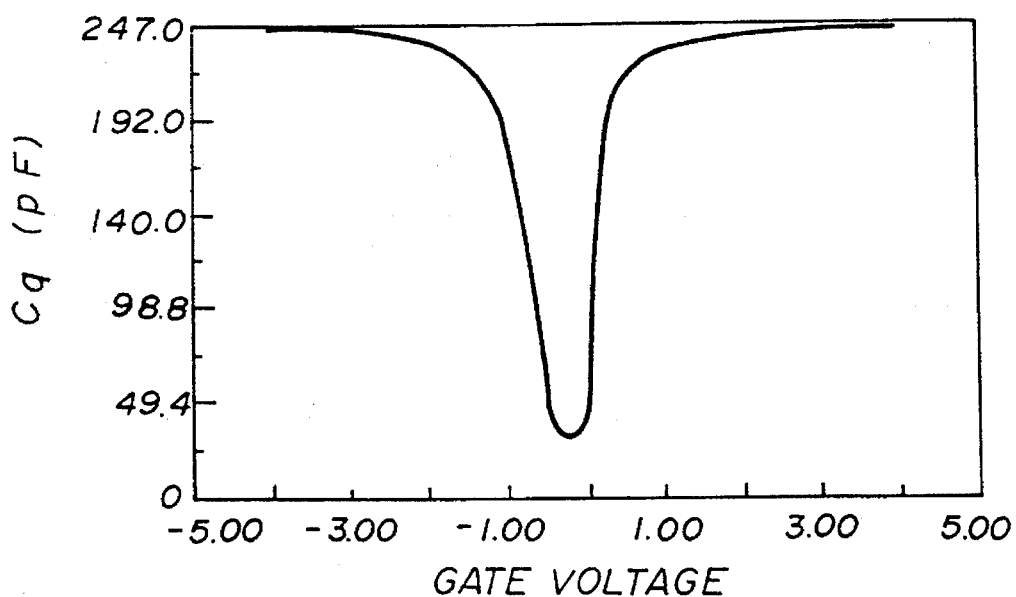

FIGS. 9(A) and 9(B) compares the quality of the silicon oxide film 12 formed on the surface of the silicon substrate 11, in terms of the quasi-static capacitance-voltage characteristics, wherein the vertical axis represents the value of capacitance while the horizontal axis represents the gate voltage applied across the electrode 13 and the substrate 11. It should be noted that FIG. 9(A) corresponds to the data for the MOS diode samples f shown in FIG. 6 while FIG. 9(B) corresponds to the data for the reference or conventional MOS diode samples a of FIG. 6.

As can be seen clearly in the drawings, there is no substantial difference in the capacitance-voltage characteristics between the curve of FIG. 9(A) and the curve of FIG. 9(B). Particularly, it should be noted that the shape of the "dip" in the capacitance-voltage characteristic curve is substantially identical in FIG. 9(A) and FIG. 9(B), indicating a successful termination of dangling bonds at the surface of the silicon oxide film 12. There is no substantial formation of surface states on the surface of the silicon oxide film 12 even when the surface of the silicon oxide film 12 is undulated. Thus, FIGS. 9(A) and 9(B) clearly indicates that there is no degradation in the quality of the silicon oxide film 12 in the MOS diode formed according to the process of FIGS. 4(A)–4(D).

Figure 10:
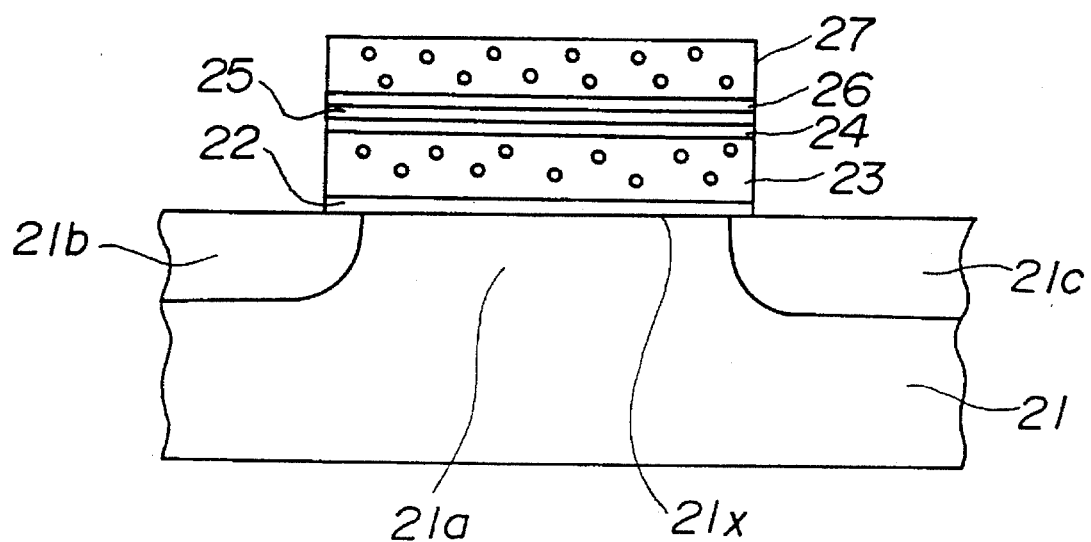
FIG. 10 is a diagram showing the structure of a flash memory according to a second embodiment of the present invention.

Next, a second embodiment of the present invention will be described with reference to FIG. 10 showing a flash memory to which the teaching of the first embodiment is applied.

Referring to FIG. 10, the flash memory is constructed on a p-type silicon substrate 21, wherein the silicon substrate 21 is subjected to the processing described with reference to FIGS. 4(A)–4(D) such that there is formed an undulation 21x at the upper major surface at least in correspondence to a channel region 21a bounded laterally in the substrate 21 by source and drain regions 21b and 21c. The channel region 21 is covered by a tunneling oxide film 22 having a thickness of about 10 nm, preferably about 7 nm, wherein the thickness changes generally periodically with a pitch of 1–20 nm. On the tunneling oxide film 22 thus formed, a floating gate electrode 23 of polysilicon is formed with a thickness of about 120 nm, and an insulation layer having a so-called ONO structure is formed on the floating gate electrode 23, wherein the insulation layer is formed of a silicon oxide layer 24 having a thickness of 12 nm and covering the upper major surface of the floating gate electrode 23, a silicon nitride layer 25 having a thickness of 12 nm and provided on the silicon oxide layer 24, and a silicon oxide layer 26 of silicon oxide provided on the silicon nitride layer with a thickness of 13 nm. On the insulation layer thus formed, there is provided a gate electrode 27 of polysilicon with a thickness of about 100 nm.

In such a structure, because of the generally periodically changing thickness of the tunneling oxide film 22 associated with the undulated surface structure 21x of the substrate 21, one can effectively reduce the electric field applied to the tunneling oxide film 22 while securing a sufficient current density of the tunneling current caused to flow through the tunneling oxide film 22 when writing or erasing data to and from the floating gate electrode. Thereby, the number of times the data is written into the flash memory increases significantly.

Next, the fabrication process of the flash memory device of FIG. 10 will be described with reference to FIGS. 11(A)–11(E).

Figure 11A:
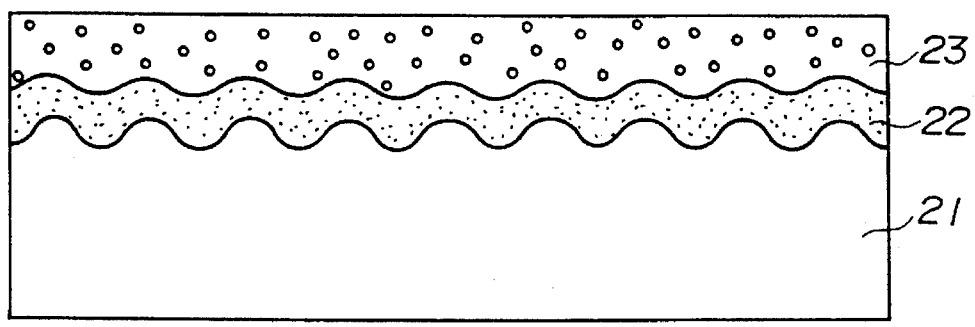
FIGS. 11(A)–11(E) are diagrams showing the fabrication process of the flash memory of FIG. 10.

The fabrication process starts with a step for forming the structure similar to the one shown in FIG. 4(D) as indicated in FIG. 11(A), wherein the substrate 21 is formed with the foregoing undulated upper major surface 21x by processing the substrate 21 successively by a cleaning solution such as the solution of HCl, $H_2O_2$ and $H_2O$ or the solution of $NH_4OH$, $H_2O_2$ and $H_2O$, or by an oxidizing agent such as $HNO_3$, followed by a selective etching process that reacts preferentially upon silicon as rather than silicon oxide, and the undulated upper major surface 21x thus formed is subjected to a thermal oxidation process at a temperature of 1000° C. in an oxidizing atmosphere that may contain about 8 volumetric percent of oxygen in nitrogen. Similarly to the first embodiment, the thermal oxidation process may be conducted for 2 minutes and 54 seconds. Thereby, the tunneling oxide film 22 of silicon is formed with an average thickness of 7 nm, with generally periodical change in the thickness of the oxide film 22 with a pitch of 1–20 nm in correspondence to the pitch of the undulated surface 21x of the silicon substrate 21. Further, a polysilicon electrode 23 is deposited on the tunneling oxide film 22 thus formed by a CVD process with a thickness of about 200 nm.

Figure 11B:
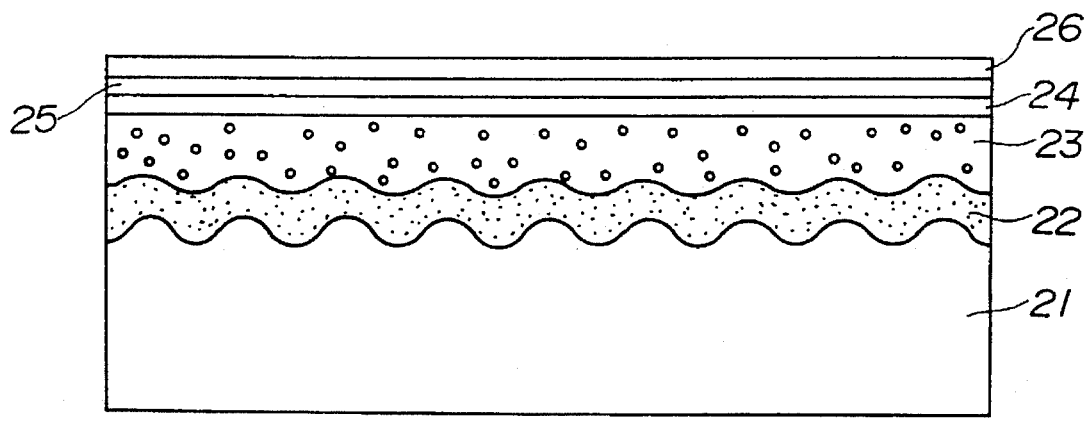

On the structure of FIG. 11(A), the silicon oxide layer 24, the silicon nitride layer 25 and the silicon oxide layer 26 are deposited consecutively by a CVD process with respective thicknesses of 12 nm, 12 nm and 13 nm. Thereby, a structure shown in FIG. 11(B) is obtained. Further, the polysilicon layer 27 is deposited on the silicon oxide layer 27 with a thickness of 100 nm by a CVD process, and a structure shown in FIG. 11(C) is obtained.

Figure 11C:
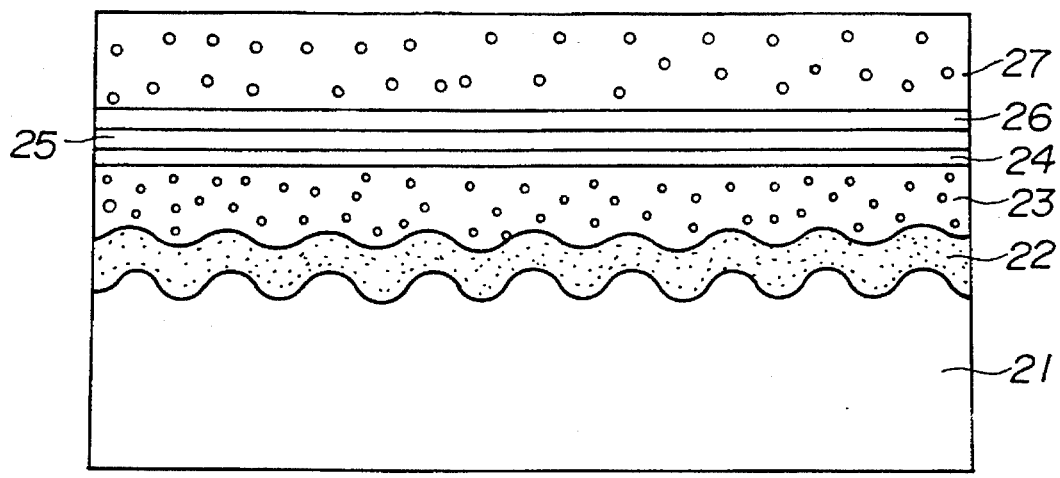
Figure 11D:
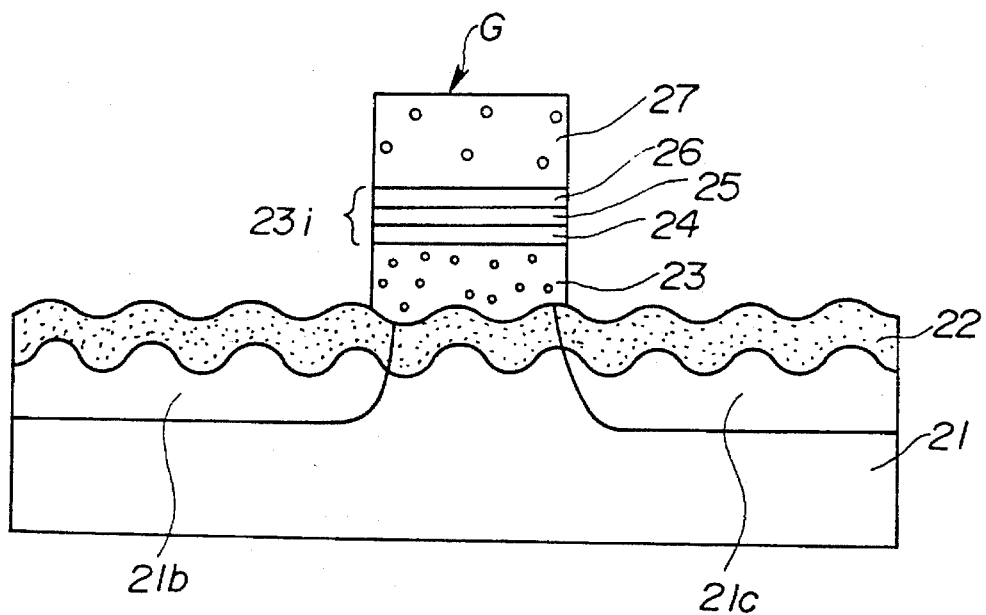
Figure 11E:
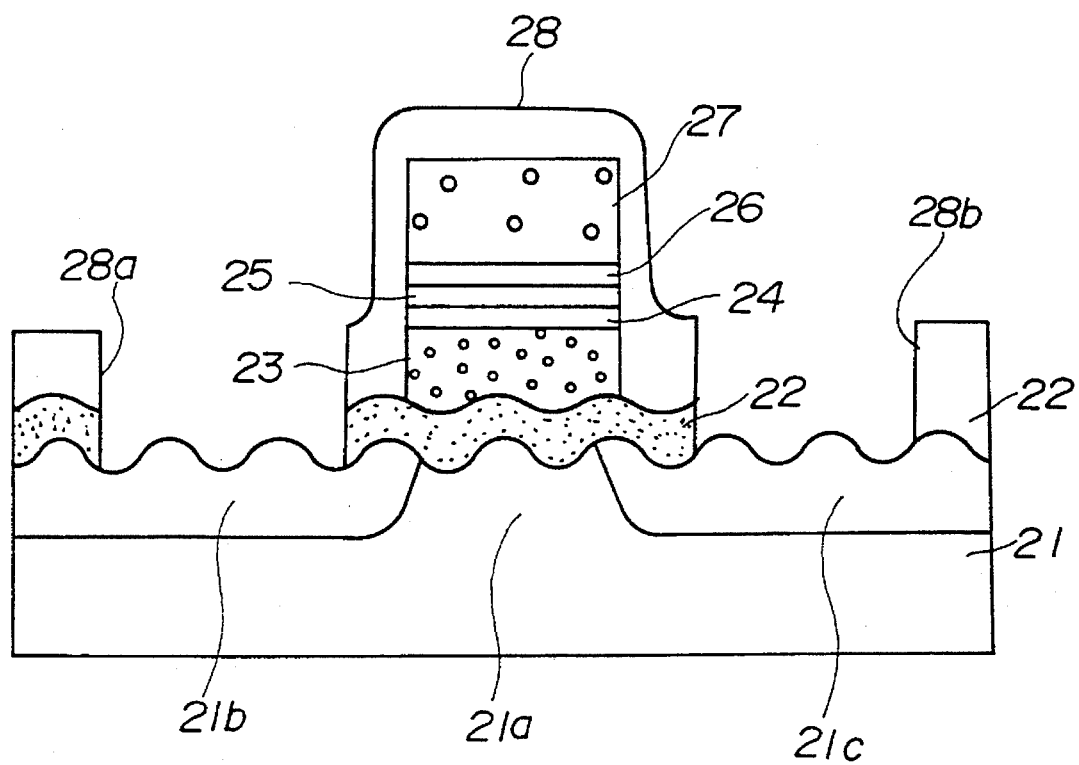

The structure of FIG. 11(C) is further subjected to a patterning process for forming a gate structure G as shown in FIG. 11(D), wherein the gate structure includes the polysilicon layer 23 forming the floating gate electrode, the layers 24–26 forming an insulation layer 23i for isolating the floating gate electrode by covering the floating gate electrode 23, and the control gate electrode 27 that is provided on the insulation layer 23i.

After the structure of FIG. 11(D) is thus formed, an ion implantation of As or P is conducted into the substrate 21 while using the gate structure G as a mask, and the diffusion regions 21b and 21c are formed as the source and drain regions.

Further, a protective layer 28 of silicon oxide is deposited on the structure of FIG. 11(D) by a CVD process, and contact holes 28a and 28b are formed on the protective layer 28 in correspondence to the source and drain regions 21b and 21c for exposing the surface of the silicon substrate in correspondence to the source and drain regions 21b and 21c. Thereby, the fabrication of a flash memory cell transistor is completed.

Further, the present invention is not limited to the embodiments described heretofore, but various variations and modifications may be made without departing from the scope of the invention.

What is claimed is:

1. A method for fabricating a non-volatile semiconductor memory device having an isolated floating gate for storing information in the form of electric charges, which comprises:

oxidizing the upper surface of a silicon substrate by reaction with an oxidizing agent to form a silicon oxide film having a thickness varying from 1–20 nm on said surface, and simultaneously selectively etching the silicon substrate surface having the silicon oxide film thereon with an etchant, which reacts with silicon more rapidly than with silicon oxide, until the silicon oxide film is removed, with an aqueous solution that contains both the oxidizing agent and the etchant;

thermally oxidizing the silicon substrate to form a tunneling oxide film of silicon oxide having a pitch varying from 1–20 nm on the upper surface of the silicon substrate; and providing a floating gate electrode on the silicon oxide film.

2. A method as claimed in claim 1, wherein the oxidizing agent is a solution of nitric acid.

3. A method as claimed in claim 1, wherein the etchant is a solution of hydrofluoric acid and nitric acid.

4. A method as claimed in claim 1, wherein the etchant is chlorine gas in the presence of ultraviolet radiation.

5. A method as claimed in claim 1, which additionally comprises covering the floating gate electrode with an insulating film and providing a control gate electrode on the insulating film.

6. A method for forming an insulating film of varying thickness on the upper surface of a silicon substrate, which comprises:

oxidizing the upper surface of a silicon substrate by reaction with an oxidizing agent to form a silicon oxide film having a thickness varying from 1–20 nm on said surface, and simultaneously selectively etching the silicon substrate having the silicon oxide film thereon with an etchant, which reacts with silicon more rapidly than with silicon oxide until the native silicon oxide film is removed, with an aqueous solution that contains both the oxidizing agent and the etchant; and thermally oxidizing the silicon substrate to form a tunneling oxide film of silicon oxide having a pitch varying from 1–20 nm on the upper surface of the silicon substrate.

7. A method as claimed in claim 6, wherein the oxidizing agent is a solution of nitric acid.

8. A method as claimed in claim 6, wherein the etchant is a solution of hydrofluoric acid and nitric acid.

9. A method as claimed in claim 6, wherein the etchant is chlorine gas in the presence of ultraviolet radiation.

* * * * *